(12) United States Patent
Terada et al.

(10) Patent No.: US 7,416,474 B2
(45) Date of Patent: Aug. 26, 2008

(54) PLANARIZATION APPARATUS

(75) Inventors: Shouichi Terada, Koshi (JP); Tsuyoshi Mizuno, Koshi (JP); Takeshi Uehara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/680,237

(22) Filed: Feb. 28, 2007

(65) Prior Publication Data
US 2007/0224918 A1  Sep. 27, 2007

(30) Foreign Application Priority Data
Mar. 10, 2006  (JP) ............................... 2006-065960

(51) Int. Cl.
*B24B 49/00* (2006.01)
(52) U.S. Cl. .................... 451/5; 451/6; 451/9; 451/10; 451/11; 451/287
(58) Field of Classification Search ............... 451/5, 451/6, 9, 10, 11, 36, 41, 285, 287, 288; 438/692, 438/697; 156/345.12, 345.13, 345.15, 345.16, 156/345.17
See application file for complete search history.

(56) References Cited

U.S. PATENT DOCUMENTS

| | | | |
|---|---|---|---|
| 6,828,225 B2 * | 12/2004 | Kondo et al. ................. | 438/622 |
| 6,921,466 B2 * | 7/2005 | Hongo et al. ................. | 204/198 |
| 7,033,252 B2 * | 4/2006 | Fuhriman et al. ............. | 451/41 |
| 2002/0006876 A1 * | 1/2002 | Hongo et al. ................ | 505/191 |
| 2004/0242121 A1 * | 12/2004 | Hirokawa et al. ............. | 451/5 |
| 2006/0286904 A1 * | 12/2006 | Swedek et al. ................ | 451/5 |
| 2007/0042681 A1 * | 2/2007 | Benvegnu et al. ............. | 451/6 |

FOREIGN PATENT DOCUMENTS

JP  2004-106084  4/2004

* cited by examiner

*Primary Examiner*—Eileen P. Morgan
(74) *Attorney, Agent, or Firm*—Oblon, Spivak, McClelland, Maier & Neustadt, P.C.

(57) ABSTRACT

The present invention is a planarization apparatus for planarizing a coating film applied on a substrate before the coating film is hardened, including a contact body such as a brush or sponge brought into contact with a front surface of the coating film on the substrate; and a contact body drive mechanism for pressing the contact body against the front surface of the coating film and moving the contact body along the front surface of the coating film. The contact body is pressed against the coating film before it is hardened, and moved along the front surface of the coating film, whereby the coating film can be planarized to a predetermined film thickness. According to the present invention, the coating film can be planarized without using the CMP apparatus.

14 Claims, 13 Drawing Sheets

PLANARIZATION APPARATUS

BACKGROUND OF THE INVENTION

1. Field of the Invention

The present invention relates to a planarization apparatus for planarizing a coating film on a substrate before the coating film is hardened.

2. Description of the Related Art

In a process of forming, for example, a multilayer wiring structure of a semiconductor integrated circuit or the like, processing of forming an insulating film between metal wirings on a wafer is performed. For the processing of forming the insulating film, for example, a coating method is widely used which is a so-called spin-coating of supplying a liquid insulating film material onto the wafer, and rotating the wafer to diffuse the insulating film material over the wafer front surface to thereby apply an insulating film on the wafer. When the insulating film is applied on the wafer, a hardening processing of hardening the insulating film under a high temperature is then performed to finally form the insulating film. The SOG (Spin On Glass) film or SOD (Spin On Dielectric) film which is common as the insulating film is formed as described above.

However, since the amount of the insulating film material entering the depressed portions varies due to the depth of steps and roughness of a base pattern when using the above-described coating method, projections and depressions may be formed on the front surface of the formed insulating film. Once the projections and depressions are formed on the front surface of the insulating film, focus is not partially achieved on the resist film at the upper layer at the time of exposure of the photolithography step, resulting in non-uniformity in the line width of the resist pattern. This also causes non-uniformity in the width of the etched trenches in the insulating film. Further, the depth of the etched trench also differs between a portion with a large thickness and a portion with a small thickness of the insulating film. If the width and the depth of the etched trench in the insulating film varies as described above, the metal wiring embedded in the trench in the insulating film differs in length and thickness, leading to non-uniformity in electric resistance of the wirings within the wafer.

Thus, the formation of the projections and depressions on the front surface of the insulating film causes various troubles in the process of forming the multilayer wiring structure and the finally formed multi-layer wiring structure.

Hence, when the insulating film is formed by the above-described coating method, the CMP (Chemical Mechanical Polishing) processing to planarize the insulating film is conventionally performed after the insulating film is hardened. The CMP processing is performed by bringing a polishing pad into contact with the wafer front surface while supplying a liquid slurry containing silica particles (a polishing liquid) to polish the wafer front surface in the CMP apparatus (Japanese Patent Application Laid-open No. 2004-106084).

However, the above-described CMP apparatus employs a polishing pad twice or larger than the wafer, and therefore is very large in size and also consumes a large amount of power. In addition, the apparatus requires use of a large amount of expensive slurry, leading to increased running cost. Furthermore, if the slurry remains on the wafer, it can contaminate or scratch the multilayer wirings. Therefore, a cleaning step performed by a dedicated cleaning unit for washing away the slurry is separately required, resulting in an increase in the number of processing steps and complexity.

SUMMARY OF THE INVENTION

The present invention has been developed in view of the above points, and its object is to form a coating film such as a planar insulating film on a substrate such as a wafer without using the above-described CMP apparatus.

To achieve the above object, the present invention is a planarization apparatus for planarizing a coating film applied on a substrate before the coating film is hardened, including: a contact body brought into contact with a front surface of the coating film on the substrate; and a contact body drive mechanism for pressing the contact body against the front surface of the coating film and moving the contact body along the front surface of the coating film to planarize the front surface of the coating film.

According to the present invention, the contact body can be pressed against the coating film before it is hardened, and moved along the front surface of the coating film to trim the front surface of the coating film to planarize the coating film. As a result, it is not necessary to perform the CMP processing on the coating film using the CMP apparatus after the coating film is hardened as in the prior art, so that the coating film can be planarized at a low cost using a relatively small apparatus. Further, use of no slurry eliminates the need to use a dedicated cleaning apparatus for removing the slurry. Thus, according to the present invention, the coating film can be planarized without using the CMP apparatus, resulting in reduced cost.

DETAILED DESCRIPTION OF THE INVENTION

Figure 1:
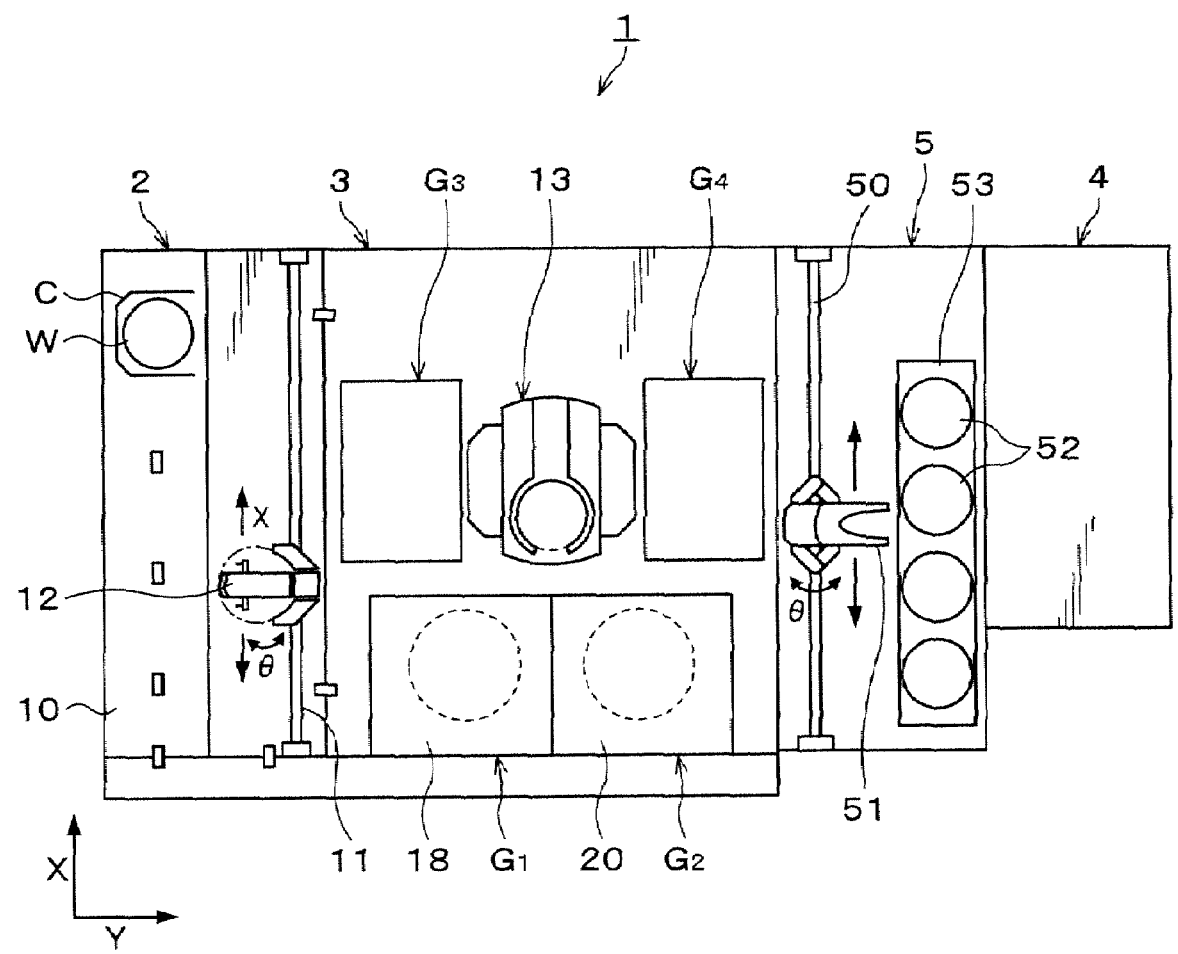
FIG. 1 is a plan view showing the outline of a configuration of a substrate processing system.
Figure 2:
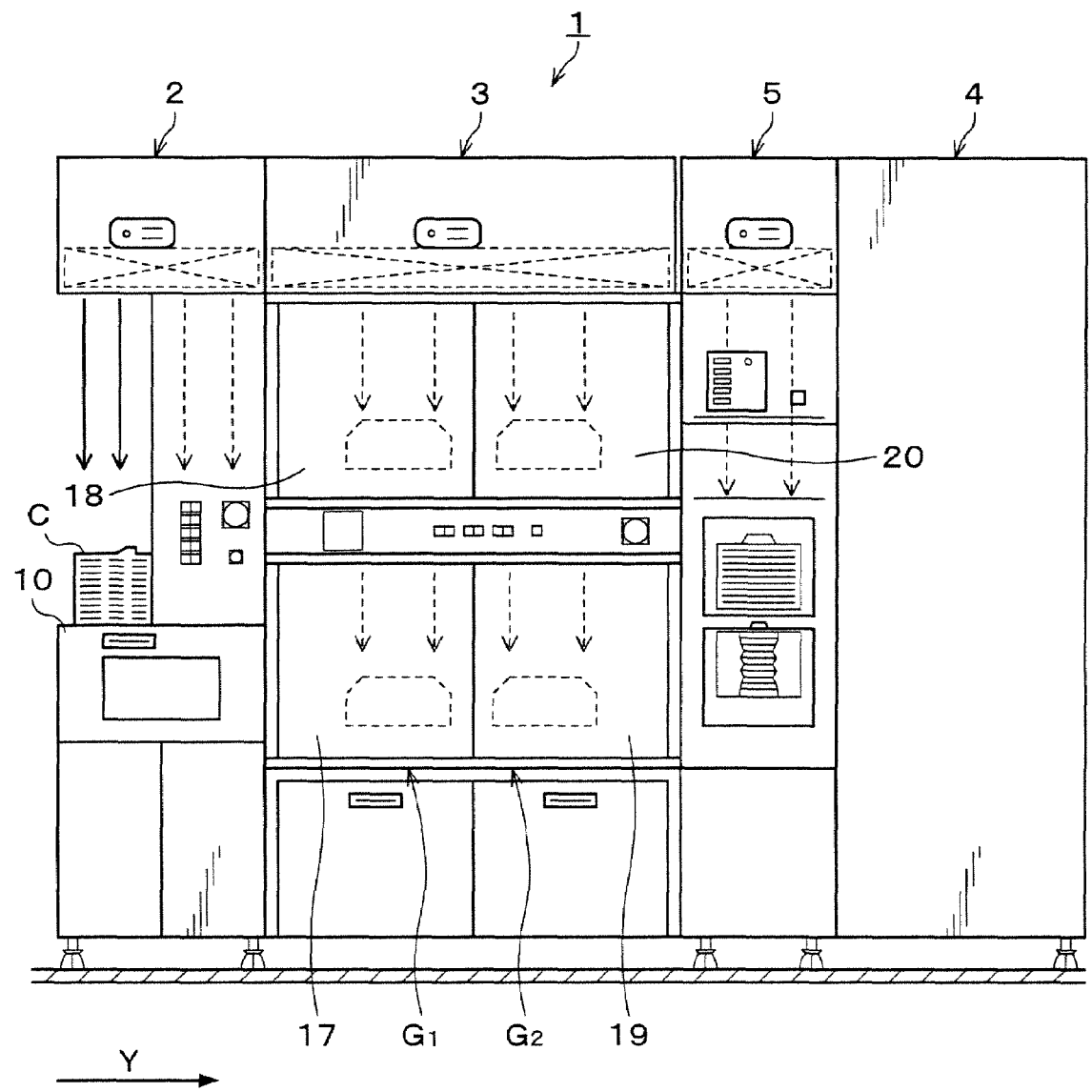
FIG. 2 is a front view of the substrate processing system in FIG. 1.
Figure 3:
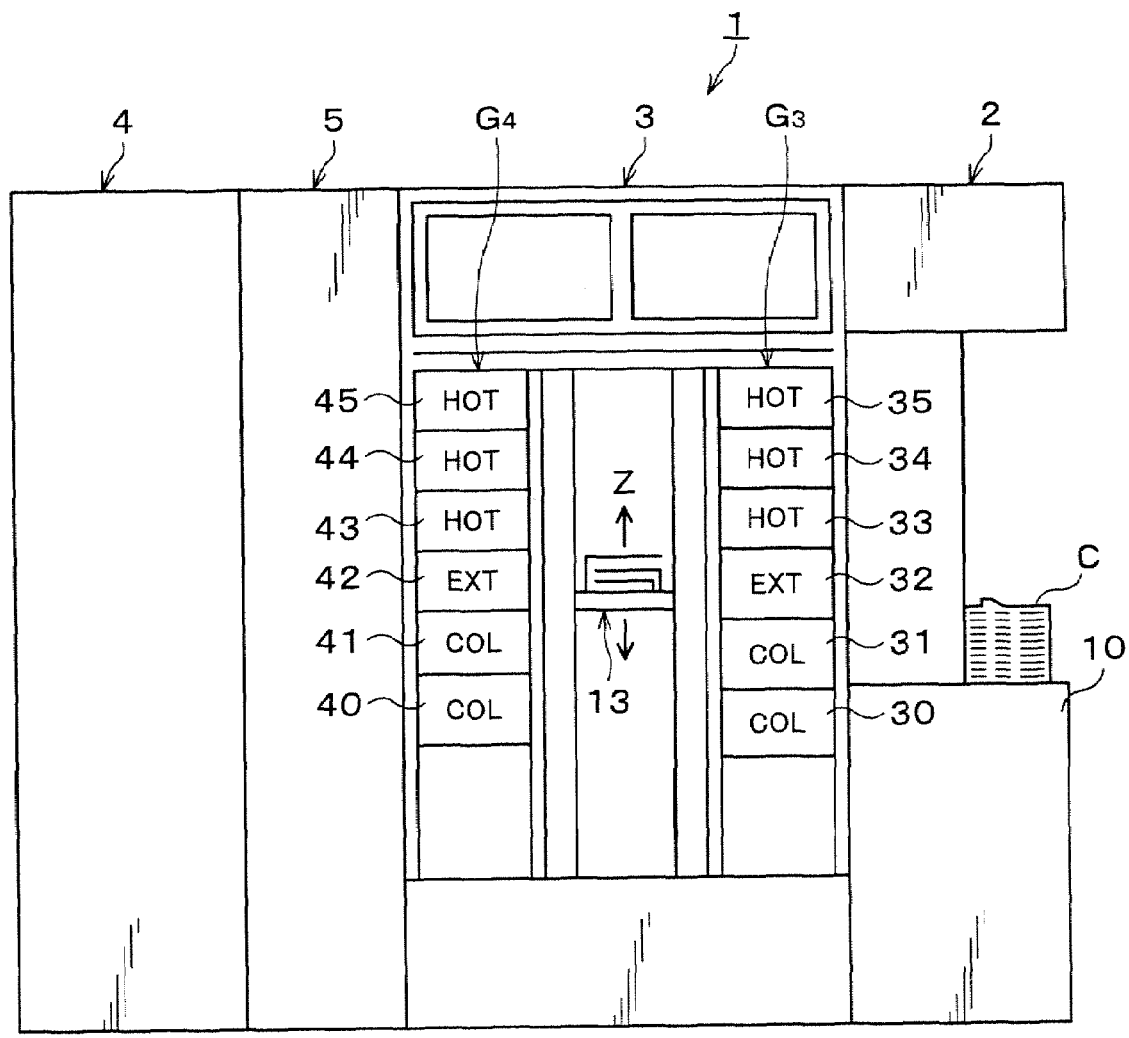
FIG. 3 is a rear view of the substrate processing system in FIG. 1.

Hereinafter, preferred embodiments of the present invention will be described. FIG. 1 is a plan view showing the outline of a configuration of a substrate processing system 1 incorporating a planarization apparatus according to the present embodiment, FIG. 2 is a front view of the substrate processing system 1, and FIG. 3 is a rear view of the substrate processing system 1.

The substrate processing system 1 has, as shown in FIG. 1, a configuration in which, for example, a cassette station 2 for transferring, for example, 25 wafers W per cassette as a unit from/to the outside into/from the substrate processing system 1 and transferring the wafers W into/out of a cassette C; a processing station 3 including a plurality of various kinds of processing and treatment units, which are multi-tiered, for performing predetermined processing or treatment in a manner of single wafer processing in a series of substrate processing; and an interface station 5 for passing the wafers W to/from a batch-type heating furnace 4 provided adjacent to the processing station 3, are integrally connected.

In the cassette station 2, a cassette mounting table 10 is provided and configured such that a plurality of cassettes C can be mounted on the cassette mounting table 10 in a line in an X-direction (a top-to-bottom direction in FIG. 1). In the cassette station 2, a wafer transfer body 12 is provided which is movable in the X-direction on a transfer path 11. The wafer transfer body 12 is also movable in a wafer-arrangement direction of the wafers W housed in the cassette C (a Z-direction; the vertical direction), and thus can selectively access the wafers W in each of the cassettes C arranged in the X-direction.

The wafer transfer body 12, which is rotatable in a θ-direction around the Z-axis, can access a later-described extension unit 32 included in a third processing unit group G3 on the processing station 3 side.

In the processing station 3, a main transfer unit 13 is provided at its central portion, and various kinds of processing and treatment units are multi-tiered to constitute processing unit groups around the main transfer unit 13. In the substrate processing system 1, four processing unit groups G1, G2, G3 and G4 are arranged. The first and second processing unit groups G1 and G2 are placed on the front side of the substrate processing system 1, the third processing unit group G3 is placed adjacent to the cassette station 2, and the fourth processing unit group G4 is placed adjacent to the interface station 5.

In the first processing unit group G1, for example, as shown in FIG. 2, a coating treatment unit 17 for applying an insulating material such as an SOG film material or an SOD film material to form a coating insulating film on the wafer W, and a planarization apparatus 18 for planarizing the coating insulating film are two-tiered in order from the bottom. In the second processing unit group G2, a coating treatment unit 19 and a planarization apparatus 20 are similarly two-tiered in order from the bottom.

In the third processing unit group G3, for example, as shown in FIG. 3, cooling processing units 30 and 31 each for cooling the wafer W, the extension unit 32 for keeping the wafer W waiting therein, heat processing units 33, 34 and 35 each for heat-processing the wafer W and the like are, for example, six-tiered in order from the bottom.

In the fourth processing unit group G4, for example, cooling processing units 40 and 41, an extension unit 42, and heat-processing units 43, 44 and 45 and the like are, for example, six-tiered in order from the bottom.

In the interface station 5, for example, as shown in FIG. 1, a wafer transfer body 51 is provided which moves on a transfer path 50 extending in the X-direction. Further, a mounting table 53, on which a plurality of wafer boats 52 can be placed side by side in the X-direction, is provided on the heating furnace 4 side in the interface station 5. The wafer boat 52 can hold a plurality of wafers W arranged at multiple tiers in the vertical direction. The wafer transfer body 51 is movable in the vertical direction and also rotatable in the θ-direction and thus can transfer the wafer W between the processing station 3 and the wafer boat 52 on the mounting table 53. The heating furnace 4 can house the wafer boat 52 from the interface station 5 and heat a plurality of wafers W at the same time.

Figure 4:
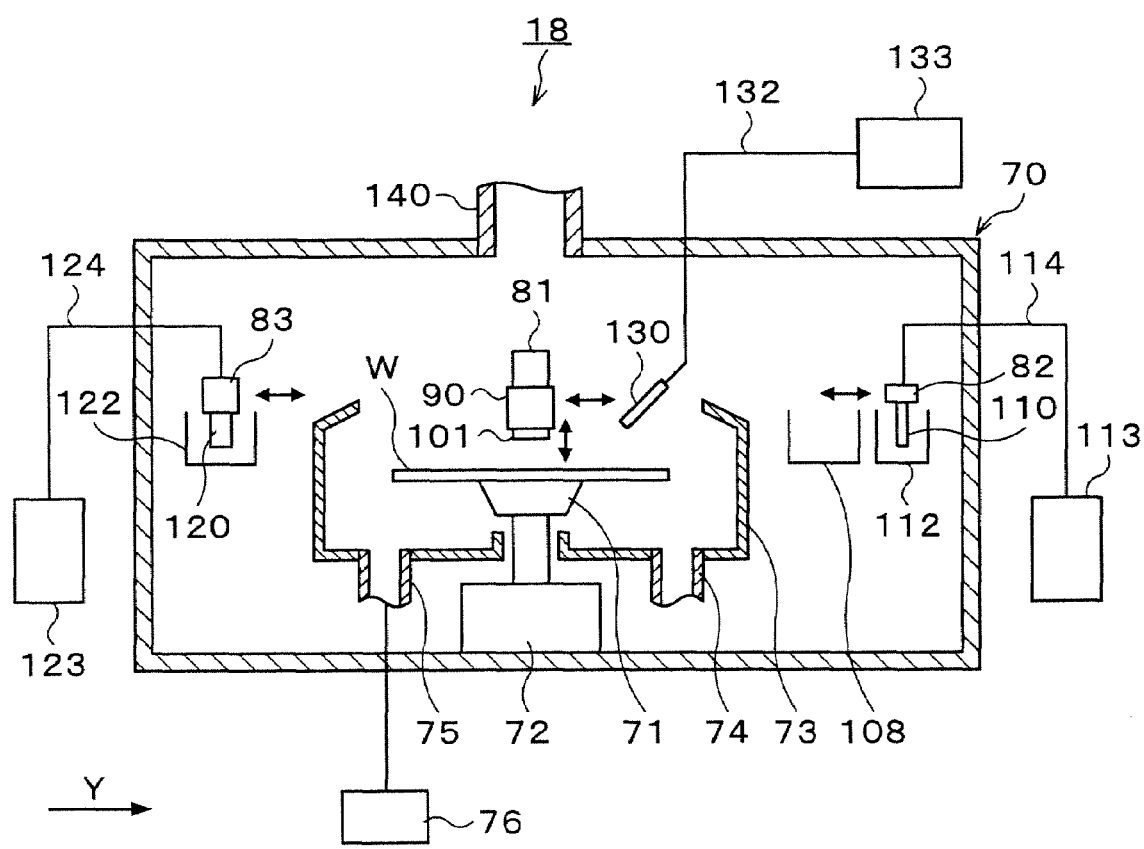
FIG. 4 is an explanatory view of a longitudinal section showing the outline of a configuration of a planarization apparatus.
Figure 5:
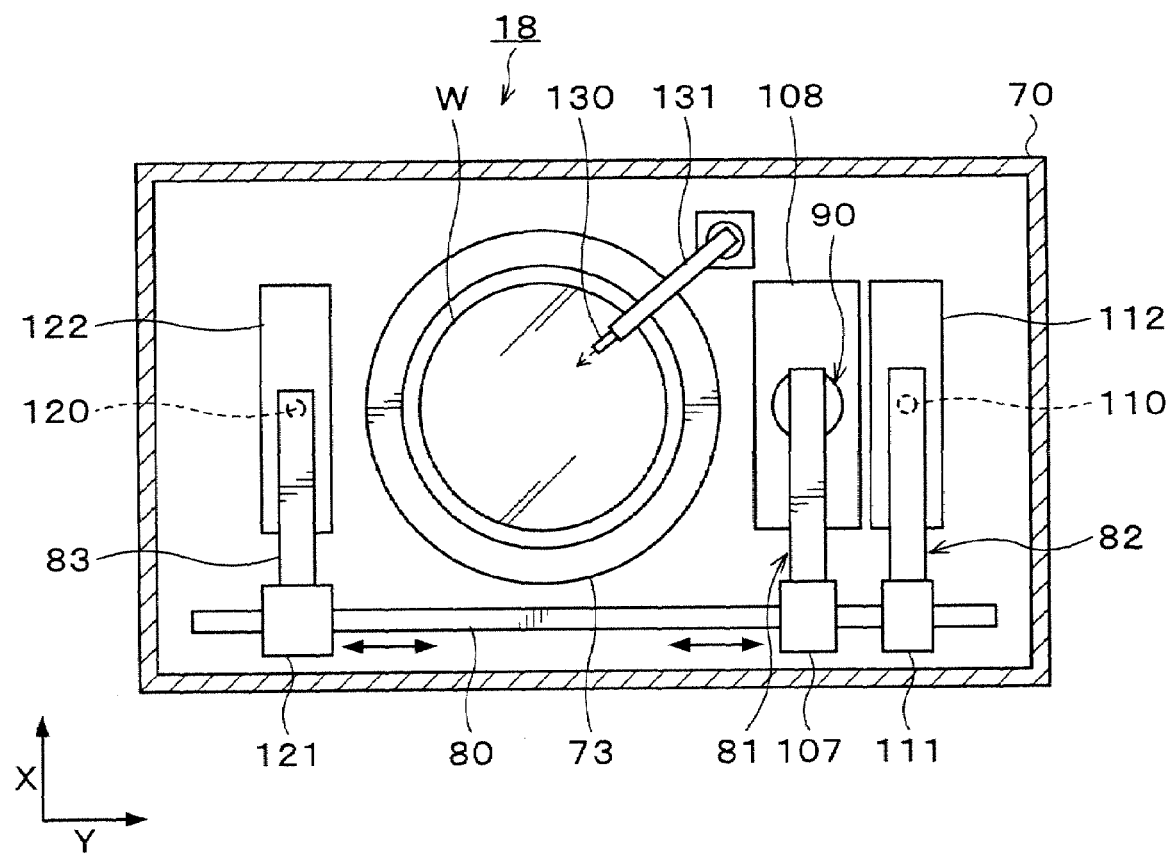
FIG. 5 is an explanatory view of a transverse section showing the outline of the configuration of the planarization apparatus.

Next, the configuration of the above-described planarization apparatuses 18 and 20 will be described. FIG. 4 is an explanatory view of a longitudinal section showing the outline of the configuration of the planarization apparatus 18, and FIG. 5 is an explanatory view of a transverse section of the planarization apparatus 18.

The planarization apparatus 18 has, for example, a casing 70 capable of closing its inside. At the central portion of the casing 70, a spin chuck 71 is provided for holding and rotating the wafer W thereon. The spin chuck 71 has a horizontal upper surface which is provided with, for example, a suction port (not shown) for sucking the wafer W. Suction through the suction port allows the wafer W to be suction-held on the spin chuck 71.

The spin chuck 71 can be rotated at a predetermined speed, for example, by a chuck drive mechanism 72 including a motor or the like. The chuck drive mechanism 72 is provided with a raising and lowering drive source such as a cylinder so that the spin chuck 71 can be vertically moved.

Around the spin chuck 71, a cup is provided which receives the liquid scattering or dropping from the wafer W and collects it. To the bottom surface of the cup 73, a drain pipe 74 for draining the collected liquid and an exhaust pipe 75 for exhausting the atmosphere in the cup 73 are connected. The exhaust pipe 75 is connected to a negative pressure generator 76 such as a pump and thus can forcibly exhaust the atmosphere in the cup 73.

As shown in FIG. 5, a rail 80 extending along the Y-direction (the lateral direction in FIG. 5) is formed on the side of the negative direction in the X-direction (the downward direction in FIG. 5) of the cup 73. The rail 80 is formed from, for example, the outside on the negative direction side in the Y-direction (the left direction in FIG. 5) of the cup 73 to the outside on the positive direction side in the Y-direction (the right direction in FIG. 5). To the rail 80, for example, three arms 81, 82, and 83 are attached.

Figure 6:
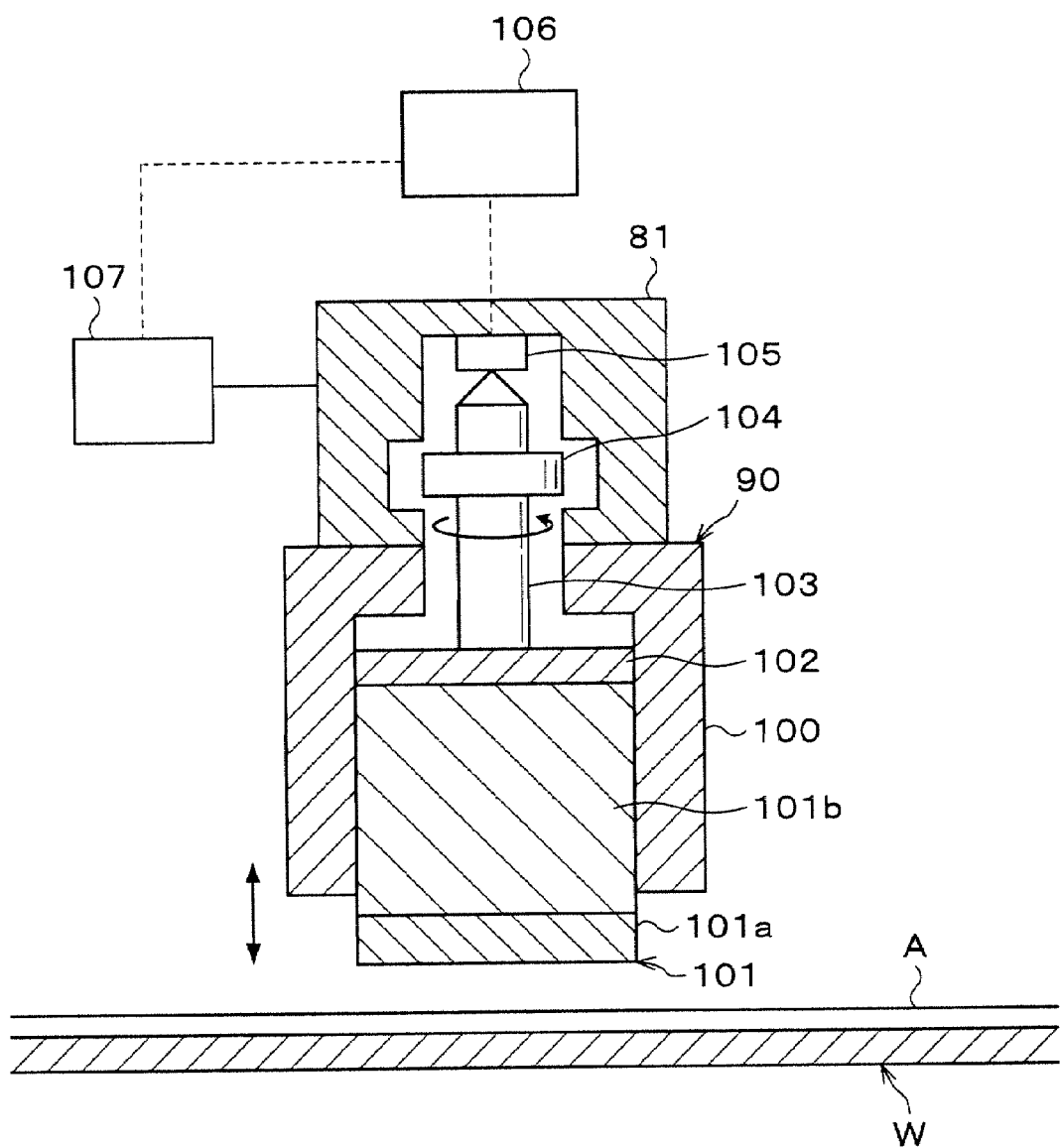
FIG. 6 is an explanatory view of a longitudinal section showing the outline of a configuration of a brush mechanism.

On the lower surface of a tip portion of the first arm 81 as a support member, a brush mechanism 90 is supported. The brush mechanism 90 comprises, as shown in FIG. 6, a case 100 in an almost cylindrical form having a bottom surface open, a brush 101 as a contact body housed in the case 100, and a rotary shaft 103 attached to the top of the brush 101 via a plate 102.

The brush 101 is formed, for example, in an almost column form having a bottom surface formed flat. The brush 101 is made of, for example, urethane and formed in a flexible sponge form. The brush 101 has a two-layer structure in which a lower-layer brush 101a is formed of hard urethane and an upper-layer brush 101b is formed of soft urethane. The top of the rotary shaft 103 penetrates the upper surface of the case 100 and is inserted into the inside of the first arm 81, and a drive belt 104 provided in the first arm 81 is wound around an upper portion of the rotary shaft 103. A not-shown drive source can be used to rotate the drive belt 104 to thereby rotate the rotary shaft 103 around the vertical axis to rotate the brush 101.

An upper end portion of the rotary shaft 103 is formed in a tapered conical shape and abuts on a pressure sensor 105 provided in the first arm 81. The pressure sensor 105 can detect a pressure received from the rotary shaft 103, that is, a pressing pressure of the brush 101 against the wafer W.

The detection result by the pressure sensor 105 can be outputted to a control unit 106, and the control unit 106 can control vertical drive of the first arm 81 by a later-described arm drive unit 107 based on the detection result so that the pressing pressure is a predetermined set pressure.

The first arm 81 is freely movable on the rail 80 in the Y-direction by means of, for example, the arm drive unit 107 shown in FIG. 5 including a motor and can move the brush 101 from a waiting section 108 located outside the cup 73 on the positive direction side in the Y-direction into the cup 73 to thereby move it in the horizontal direction on the front surface of the wafer W. The arm drive unit 107 also includes a cylinder which expands and contracts, for example, in the vertical direction, and the cylinder can be used to raise and lower the first arm 81. This can raise and lower the first arm 101 and press the brush 101 against the front surface of the wafer W at the predetermined pressure. Note that in the present embodiment, for example, the rail 80, the first arm 81, and the arm drive unit 107 constitute a contact body drive mechanism.

On the second arm 82, a processing liquid supply nozzle 110 as a processing liquid supply unit is supported as shown in FIG. 4. The second arm 82 is freely movable on the rail 80 in the Y-direction, for example, by means of an arm drive unit 111 as shown in FIG. 5, and can move the processing liquid supply nozzle 110 from a waiting section 112 provided outside the cup 73 on the positive direction side in the Y-direction into the cup 73 and move it in the horizontal direction above the wafer W. The arm drive unit 111 include a cylinder which expands and contracts in the vertical direction, and the cylinder can be used to raise and lower the second arm 82 to adjust also the height of the processing liquid supply nozzle 110.

To the processing liquid supply nozzle 110, a supply pipe 114 is connected which communicates with a processing liquid supply source 113 as shown in FIG. 4. In the present embodiment, the processing liquid supply source 113 stores a solvent for the insulating material, for example, the solvent for the SOG film material such as dibutyl ether (DBE), or the solvent for the SOD film material such as γ-butyrolactone or cyclohexanone. Note that pure water or a mixed liquid of a solvent and pure water may be used as the processing liquid.

On the third arm 83, a spray nozzle 120 as a cleaning solution supply unit is supported which sprays a cleaning solution at a high pressure. The third arm 83 is freely movable on the rail 80 in the Y-direction, for example, by means of an arm drive unit 121 as shown in FIG. 5, and can move the cleaning solution spray nozzle 120 from a waiting section 122 provided outside the cup 73 on the negative direction side in the Y-direction into the cup 73 and move it in the horizontal direction above the wafer W. The third arm 83 can freely rise and lower, for example, by means of the arm drive unit 121 to adjust also the height of the spray nozzle 120.

To the cleaning solution spray nozzle 120, a supply pipe 124 is connected which communicates with a cleaning solution supply source 123 as shown in FIG. 4. In the present embodiment, the cleaning solution supply source 123 stores a solvent for the insulating material, for example, the solvent for the SOG film material such as dibutyl ether (DBE), or the solvent for the SOD film material such as γ-butyrolactone or cyclohexanone. Note that pure water or a mixed liquid of a solvent and pure water may be used as the cleaning solution.

A sub-nozzle 130 for discharging a processing liquid is provided above the spin chuck 71 in the cup 73. The sub-nozzle 130 is fixed by an arm 131, for example, as shown in FIG. 5, and is directed to a position off the center of the wafer W on the spin chuck 71, for example, near the middle of the central portion and the outer peripheral portion of the wafer W. The sub-nozzle 130 communicates with a processing liquid supply source 133 via a supply pipe 132 as shown in FIG. 4. The processing liquid supply source 133 stores the solvent for the insulating material that is the same as that in the above-described processing liquid supply source 113, for example, the solvent for the SOG film material or the solvent for the SOD film material.

The central portion of the ceiling of the casing 70 is formed with an air supply port 140.

The control of the wafer processing in the planarization apparatus 18 is conducted, for example, by a control unit 106. The control unit 106 is, for example, a computer including a program storage unit. The program storage unit stores a program for controlling the operations of the drive system of the above-described spin chuck 71, arms 81 to 83 and so on and the start and stop of the liquids from the nozzles 110, 120, and 130 so as to execute the later-described planarization processing. Note that the program is recorded on a computer-readable recording medium and may be installed into the control unit 106 from the recording medium.

Note that the configuration of the planarization apparatus 20 is the same as that of the above-described planarization apparatus 18, and therefore the description thereof is omitted.

Next, the planarization processing performed in the planarization apparatus 18 configured as described will be described together with the process of the wafer processing performed in the whole substrate processing system 1.

First of all, a wafer W is taken out of the cassette C on the cassette mounting table 10 by the wafer transfer body 12 and transferred to the cooling processing unit 30 via the extension unit 32 in the third processing unit group G3. The wafer W transferred to the cooling processing unit 30 is temperature-adjusted to a predetermined temperature and then transferred to the coating treatment unit 17 by the main transfer unit 13.

Figure 7:
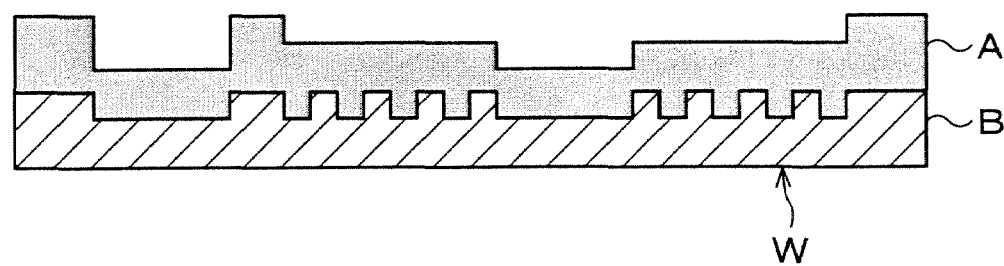
FIG. 7 is an explanatory view of a longitudinal section of a wafer showing the state in which a coating insulating film is formed on a base pattern.

In the coating treatment unit 17, the liquid insulating material is dripped, for example, to the central portion of the rotated wafer W, so that the insulating material is diffused over the entire front surface of the wafer W to form a coating insulating film on the front surface layer of the wafer W. In this event, when microscopically viewing the front surface of the wafer W, as shown in FIG. 7, the front surface of the coating insulating film A rises at portions where depressed portions of the projections and depressions of a base pattern B occupy a relatively small area, while the front surface lowers at portions where depressed portions of the base pattern B occupy a relatively large area. As described above, projections and depressions are formed on the front surface of the coating insulating film A, which correspond to the projections and depressions of the base pattern B.

The wafer W on which the coating insulating film A has been formed in the coating treatment unit 17 is transferred, for example, to the heat processing unit 33. In the heat processing unit 33, the wafer W is heated. In the heating processing step, the wafer W is heated at a low temperature of about 150° C. to evaporate a portion of the solvent in the coating insulating film A so that the coating insulating film A is semidried.

The wafer W is then transferred to the cooling processing unit 31 and cooled there to a predetermined temperature, and is then transferred to the planarization apparatus 18.

Figure 8:
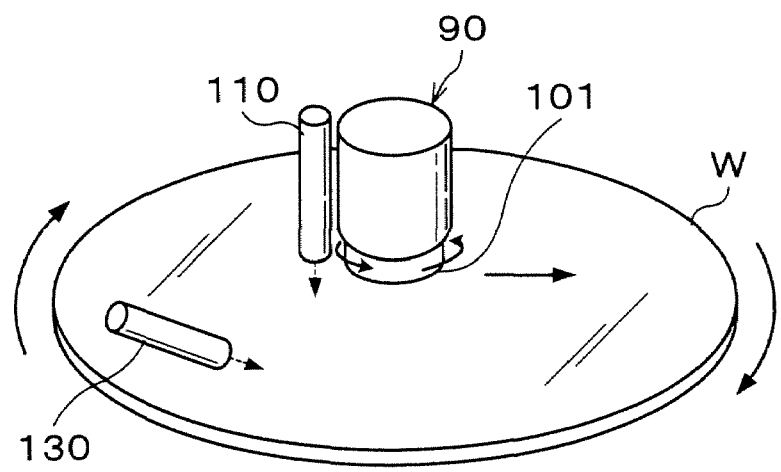
FIG. 8 is an explanatory view showing an arrangement of the brush mechanism, a processing liquid supply nozzle, and a sub-nozzle during a planarization step.
Figure 9A:
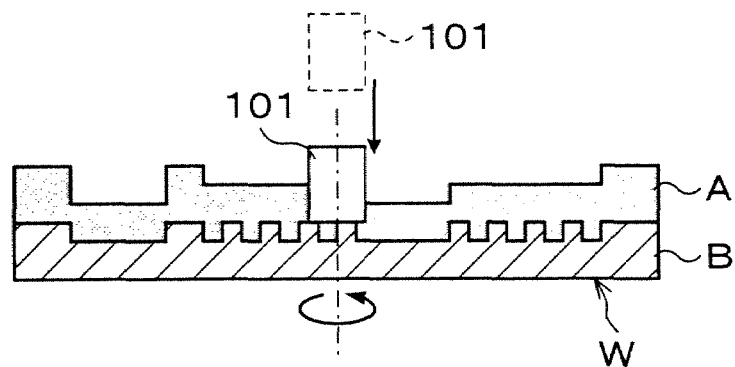
FIG. 9A is an explanatory view of a longitudinal section showing the state in which a brush is pressed against the center of the wafer.
Figure 9B:
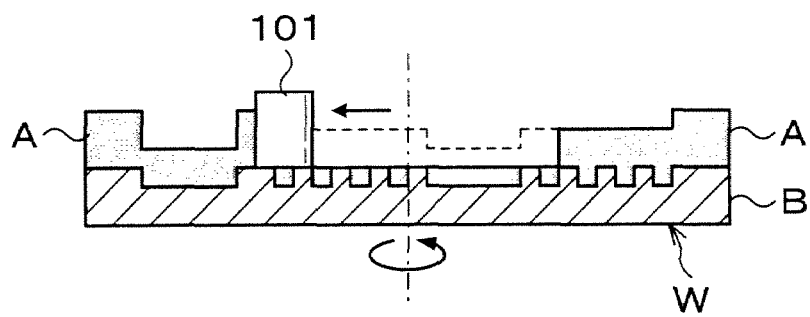
FIG. 9B is an explanatory view of a longitudinal section showing the state in which the brush is horizontally moved.
Figure 9C:
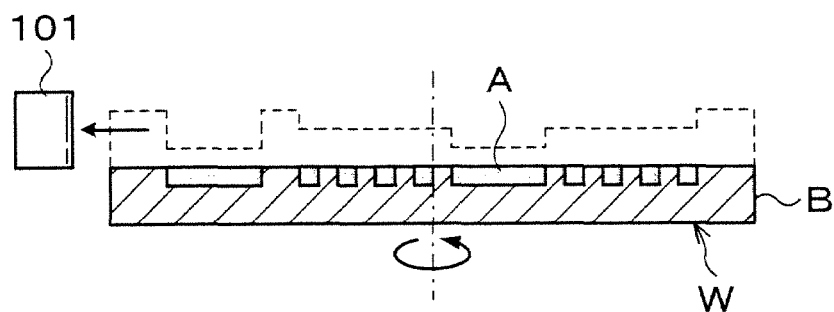
FIG. 9C is an explanatory view of a longitudinal section showing the state in which the brush reaches a position outside the wafer.

In the planarization apparatus 18, air supply from the air supply port 140 and exhaustion from the exhaust pipe 75 by the negative pressure generator 76 are being performed to form downflow in the cup 73. The wafer W transferred to the planarization apparatus 18 is first suction-held on the spin chuck 71 as shown in FIG. 4. Subsequently, the brush 101 and the processing liquid supply nozzle 110 are moved to positions above the center of the wafer W as shown in FIG. 8. Thereafter, the wafer W is rotated, and the solvent is discharged to a position near the center of the wafer W from the processing liquid supply nozzle 110. Further, the solvent is discharged from the sub-nozzle 130 to a position about the middle on the radius of the wafer W. On the other hand, rotation of the brush 101 is also started. In that state, the brush 101 is lowered and pressed against the coating insulating film A on the front surface layer of the wafer W at a predetermined pressure that has been previously set as shown in FIG. 9A. This trims the coating insulating film A down to a predetermined depth from its front surface. Where the coating insulating film A projecting over from the trenches of the base pattern B is removed as shown in FIG. 9A, the coating insulating film A is removed by the brush 101 down to a depth of the upper surface of the projections and depressions of the base pattern B. The brush 101 is then horizontally moved in a radial direction along the Y-direction to horizontally trim the surface layer of the coating insulating film A as shown in FIG. 9B. The depth for trimming is arbitrary determined in this event, and the surface layer of the coating insulating film A may be trimmed so that a thin coating insulating film A is left on the top surface of the base pattern B. The brush 101 is then moved to the outside of the wafer W as shown in FIG. 9C, so that the front surface of the coating insulating film A is trimmed to be planarized over the entire wafer front surface.

Figure 10:
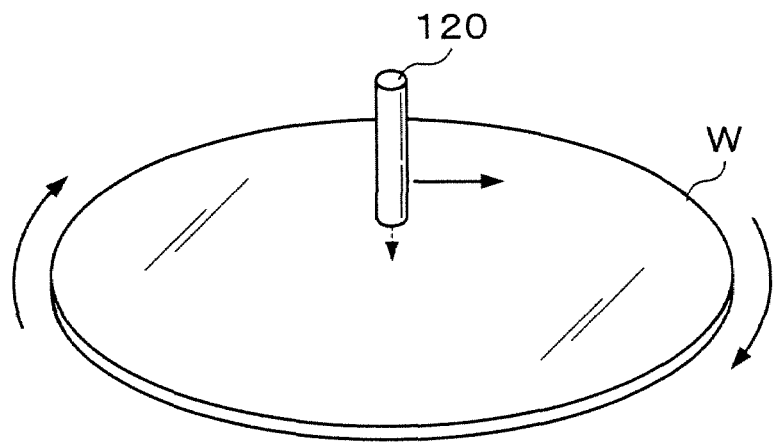
FIG. 10 is an explanatory view showing an arrangement of a spray nozzle during a cleaning step.

After the brush 101 reaches a position outside the wafer W, the brush 101 and the processing liquid supply nozzle 110 are returned to the waiting sections 108 and 112, with which the planarization step ends. With the wafer W kept rotated, for example, the spray nozzle 120 is moved to a position above the center of the wafer W this time as shown in FIG. 10. The spray nozzle 120 moves from the position above the center to the outside of the wafer W while spraying the solvent. This washes away the residual of the coating insulating film A remaining on the wafer W to thereby clean the wafer W. The spray of the solvent from the spray nozzle 120 is then stopped, and shake-off drying by rotation at a high speed is performed for the wafer W. The rotation of the wafer W is then stopped, with which a series of planarization processing ends.

The wafer W for which the planarization processing has been finished is transferred from the planarization apparatus 18, for example, to the extension unit 42, and transferred from the extension unit 42 to the interface station 5. The wafer W is then housed in the wafer boat 52, and at the time when a predetermined number of wafers W are housed in the wafer boat 52, the wafers W are transferred to the heating furnace 4 on a wafer boat 52 basis. In the heating furnace 4, the wafer W is heated under an atmosphere at a high temperature and a high humidity, for example, at 400° C. or higher so that the coating insulating film A is hardened with a chemical reaction. Note that, for the SOG film, a combination reaction of the SOG film is performed in this hardening step.

The wafer W for which the hardening processing has been finished is returned to the processing station 3, for example, via the interface station 5 and returned from the processing station 3 to the cassette station 2, and then returned by the wafer transfer body 12 into the cassette C.

According to the above embodiment, the brush 101 is pressed against the coating insulating film A before hardened and is moved along the wafer front surface to trim the front surface of the coating insulating film A for planarization in the planarization apparatus 18. Since the coating insulating film A is planarized when the coating insulating film A is in a "soft" state before it is hardened as described above, the CMP apparatus as in the prior art is not necessary any longer, resulting in that the coating insulating film A can be planarized at a low cost by an apparatus with a small size and a simple configuration. Besides, since no slurry is used, a cleaning treatment by a dedicated cleaning apparatus for washing away the slurry is not necessary.

Since the brush 101 is pressed against the wafer W and moved with the wafer W being rotated by the spin chuck 71, the coating insulating film A on the entire wafer W can be uniformly planarized. Since the brush 101 itself is also rotated, the ability of the brush 101 to trim the coating insulating film A can be further improved.

The processing liquid supply nozzle 110 is provided in the planarization apparatus 18 to planarize the coating insulating film A with the solvent being supplied, whereby the surface to be machined of the coating insulating film A can be softened to allow for appropriate machining performed by the brush 101. Further, the supply of the solvent can also wash away the residual of the coating insulating film A while removing the frictional heat between the brush 101 and the coating insulating film A.

Since the sub-nozzle 130 is used to supply the solvent also near the middle of the radius of the wafer W, the solvent can be sufficiently supplied even to the outer edge portion of the wafer W to allow for appropriate machining performed on the entire wafer W.

Further, spray of the solvent to the wafer W by the spray nozzle 120 after completion of planarization can remove the residual of the coating insulating film A remaining on the wafer W to appropriately clean the wafer W.

Figure 11:
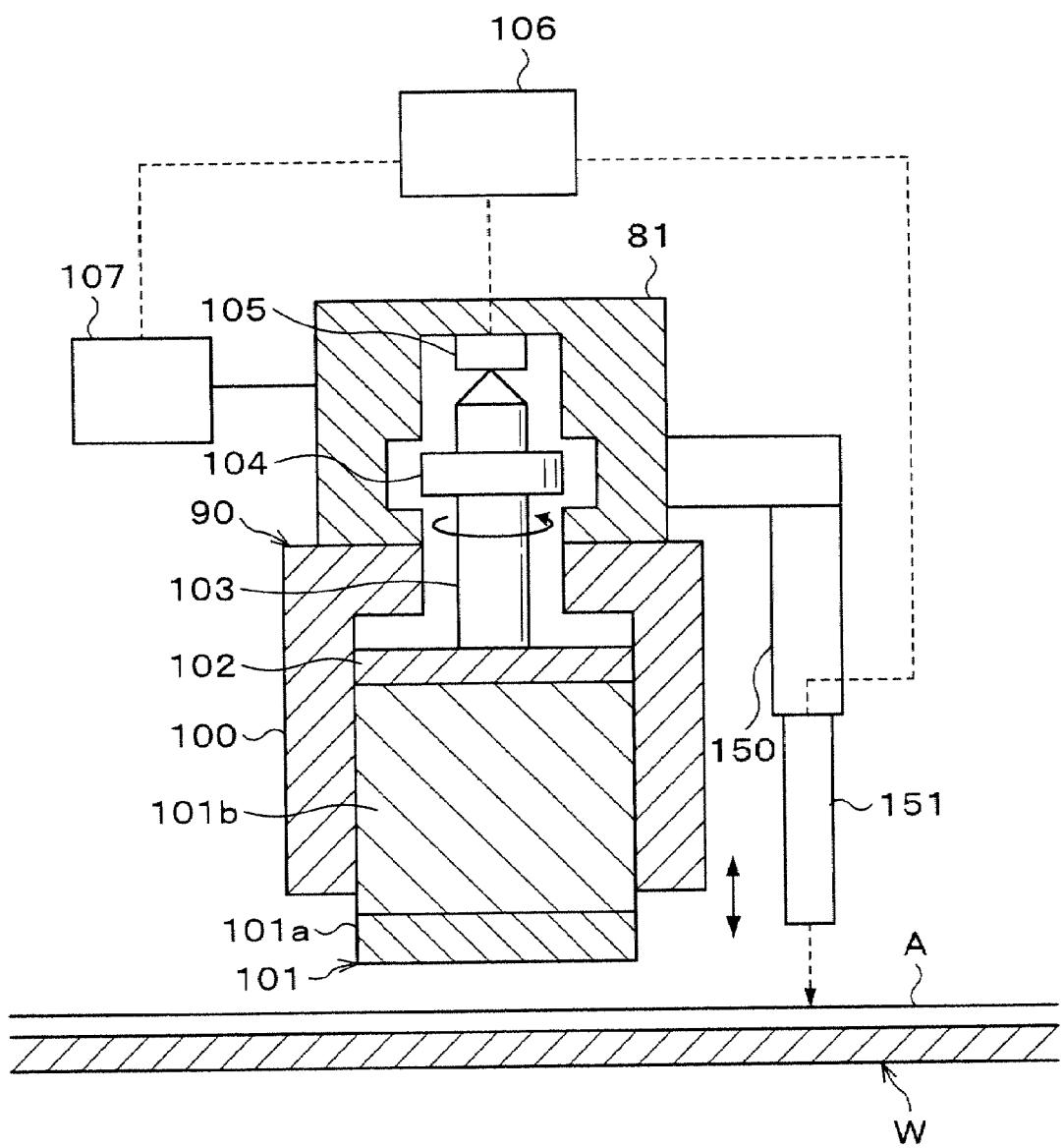
FIG. 11 is an explanatory view of a longitudinal section showing the outline of the configuration of the brush mechanism where it includes a film thickness sensor.

While the brush 101 is pressed against the coating insulating film A at the previously set pressure in the above embodiment, the film thickness of the coating insulating film A may be detected so that, based on the film thickness, the pressure of the brush 101 pressed against the coating insulating film A may be controlled to planarized the coating insulating film A to a predetermined thickness. In this case, for example, a film thickness sensor 151 is held on the first arm 81, for example, via a holding member 150 as shown in FIG. 11. The film thickness sensor 151 is provided at a position adjacent to the brush 101 and side by side with the brush 101. The film thickness detection result of the coating insulating film A detected by the film thickness sensor 151 is outputted, for example, to the control unit 106. Based on the film thickness detection result, the control unit 106 can control the vertical drive of the first arm 81 by the arm drive unit 107 to adjust the pressing pressure of the brush 101 so as to planarize the coating insulating film A to the predetermined film thickness. More specifically, the control unit 106 determines whether or not the coating insulating film A has been trimmed to the predetermined film thickness based on the film thickness detection result, and if it has been trimmed to the predetermined film thickness, the planarization process is finished, whereas if it has not been trimmed to the predetermined film thickness, the planarization process is performed again with an increased pressing pressure by the brush 101.

In the planarization processing in the planarization apparatus 18 in the above configuration, the brush 101 is moved once from the central portion to the outer edge portion of the wafer W with the brush 101 pressed against the coating insulating film A, and thereafter the film thickness of the coating insulating film A is detected by the film thickness sensor 151. Then, if the coating insulating film A has been planarized to the predetermined film thickness that has been previously set, the brush 101 is raised by the first arm 81, with which the planarization step ends. If the coating insulating film A has not been planarized to the predetermined film thickness, the pressing pressure of the brush 101 is increased and the brush 101 is moved again from the central portion to the outer edge portion of the wafer W to perform the planarization step. Thereafter, the film thickness of the coating insulating film A is detected again by the film thickness sensor 151, and if the coating insulating film A has not been planarized to the predetermined film thickness, the pressure of the brush 101 is further increased and the planarization step by the brush 101 is performed. This repeat is performed until the coating insulating film A reaches the predetermined film thickness.

In this case, since the planarization is performed while the film thickness sensor 151 is actually detecting the film thickness of the coating insulating film A, the coating insulating film A can be planarized to the predetermined thickness more precisely and surely.

Figure 12:
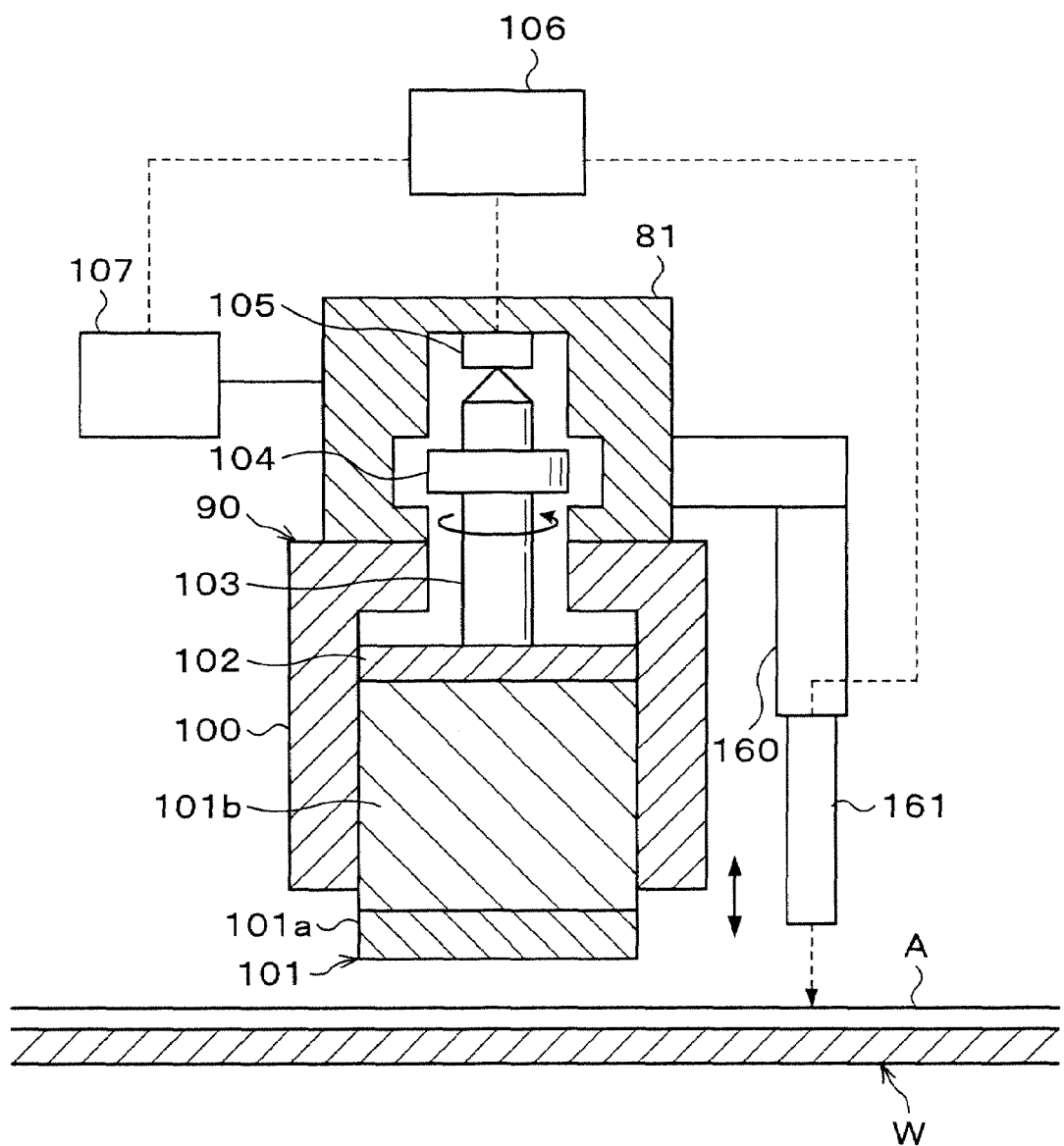
FIG. 12 is an explanatory view of a longitudinal section showing the outline of the configuration of the brush mechanism where it includes a laser displacement gauge.

Incidentally, the wafer W in the planarization apparatus 18 may suffer from slight distortion due to the suction force by the spin chuck 71. Therefore, the distortion of the wafer W may be detected so that, based on the distortion, the brush 101 may be adjusted in height to planarize the coating insulating film A to the predetermined film thickness. In this case, for example, a laser displacement gauge 161 as a distortion detection sensor is attached to the first arm 81 via a holding member 160 as shown in FIG. 12. The laser displacement gauge 161 can measure the distance with respect to the wafer W to detect the concavity and convexity (distortion) of the front surface of the wafer W. The detection result of the distortion of the wafer front surface detected by the laser displacement gauge 161 is outputted, for example, to the control unit 106. Based on the distortion detection result, the control unit 106 can control the vertical drive of the first arm 81 by the arm drive unit 107 to adjust the height of the brush 101 with respect to the wafer W so as to planarize the coating insulating film A to the predetermined film thickness.

Then, in the planarization processing, the laser displacement gauge 161 first scans over the rotated wafer W to detect the distortion within the wafer. The brush 101 is then pressed against the front surface of the coating insulating film A and horizontally moved while trimming the front surface of the coating insulating film A. In this event, the brush 101 is vertically moved according to the distortion of the wafer W to keep the distance constant between the brush 101 and the front surface of the wafer W. In this case, even if distortion occurs in the wafer W due to the spin chuck 71, the coating insulating film A can be planarized to have a uniform thickness within the wafer.

Figure 13:
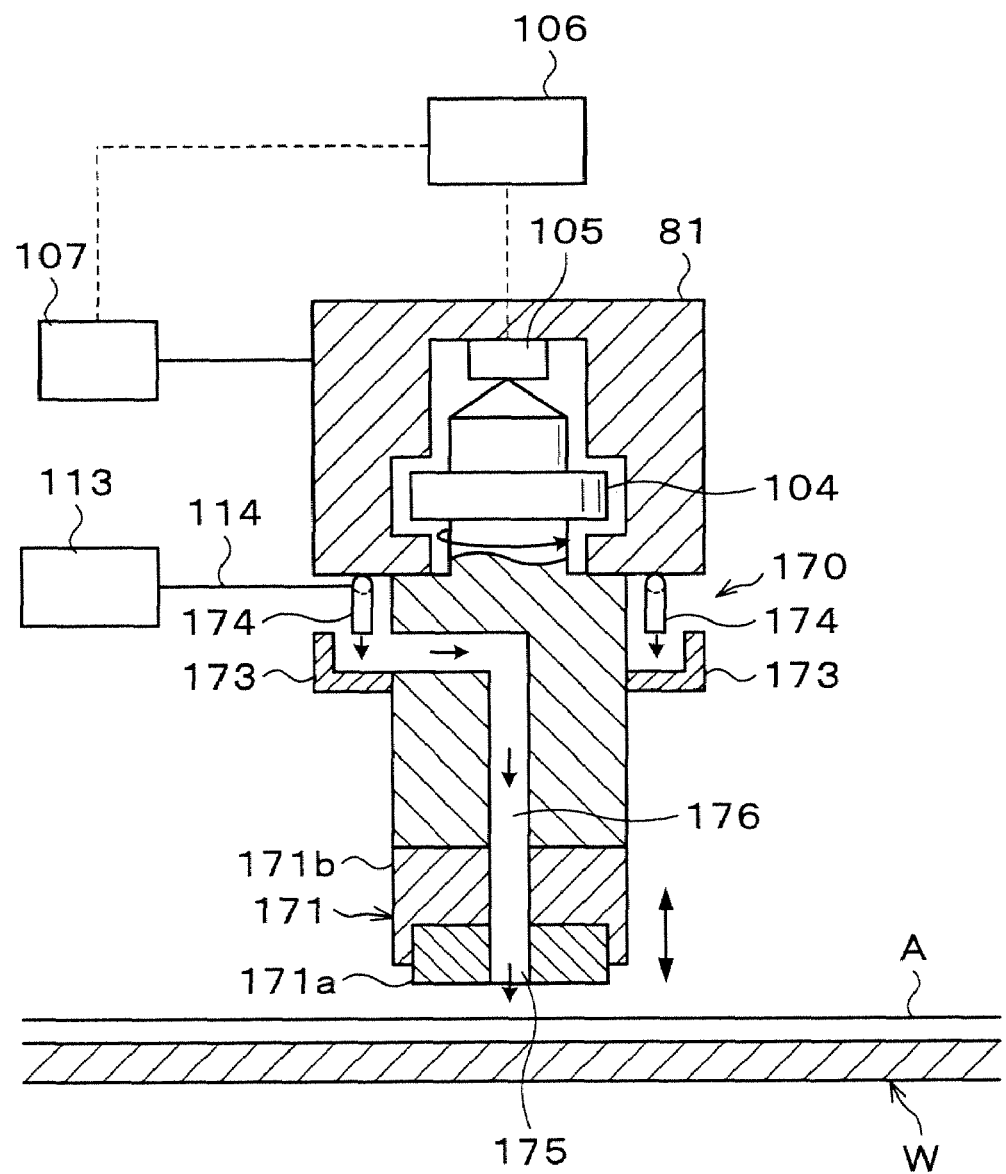
FIG. 13 is an explanatory view of a longitudinal section showing the outline of the configuration of the brush mechanism where a liquid supply port is provided at the center of the brush.

While the processing liquid supply nozzle 110 that is separate from the brush 101 is provided in the above embodiment, a processing liquid supply unit may be formed in the brush 101 itself. In this case, a brush mechanism 170 supported on the first arm 81 comprises, for example, a brush 171 in a column shape composed of a hard lower-layer brush 171*a* and a soft upper-layer brush 171*b*, a rotary shaft 172 attached to an upper portion of the brush 171, a liquid storage container 173 attached to the outer peripheral surface of the rotary shaft 172, and nozzles 174 for supplying a processing liquid to the liquid storage container 173 as shown in FIG. 13.

The nozzles 174, for example, are provided, for example, at two locations on the lower surface of the first arm 81 and their discharge directions are directed downward. The liquid storage container 173 is formed below the nozzle 174 and over the entire outer peripheral surface of the rotary shaft 172. Inside the rotary shaft 172 and the brush 171, a liquid passage 176 is formed which leads to a liquid supply port 175 as a processing liquid supply unit at the center of the lower surface of the brush 171. The liquid passage 176 leads to the liquid supply port 175 from the outer peripheral surface of the rotary shaft 172 facing the inside of the liquid storage container 173 passing through the central axis of the rotary shaft 172 and the central axis of the brush 171.

The nozzle 174 communicates with to the processing liquid supply source 113 via the supply pipe 114 described in the above embodiment. Further, the lower-layer brush 171*a* of the brush 171 has a diameter smaller than that of the upper-layer brush 171*b* and fitted in a recessed portion formed in the lower surface of the upper-layer brush 171*b*. The drive belt 104 in the first arm 81 is wrapped around the rotary shaft 172 as in the above embodiment so that the rotary shaft 172 can be rotated by the drive belt 104. The upper end portion of the rotary shaft 172 is formed in a tapered conical shape and abuts on the pressure sensor 105 provided in the first arm 81.

In the planarization processing, the brush 171 rotating on its axis is pressed against the central portion of the rotated wafer W at a predetermined pressure, and the solvent as the processing liquid is discharged from the nozzle 174. The solvent is received by the liquid storage container 173 from which the solvent passes through the liquid passage 176 and is supplied from the liquid supply port 175 to the central portion of the wafer W. Thereafter, the brush 171 is moved from the central portion to the outer edge portion of the wafer W to planarize the front surface of the coating insulating film A.

According to this embodiment, since the solvent is discharged from the center of the brush 171, the solvent can be efficiently supplied to a contact portion between the brush 171 and the coating insulating film A. Accordingly, the frictional heat between the brush 171 and the coating insulating film A can be appropriately eliminated. Further, the arm of the processing liquid supply nozzle 110 becomes unnecessary to simplify the apparatus.

Figure 14:
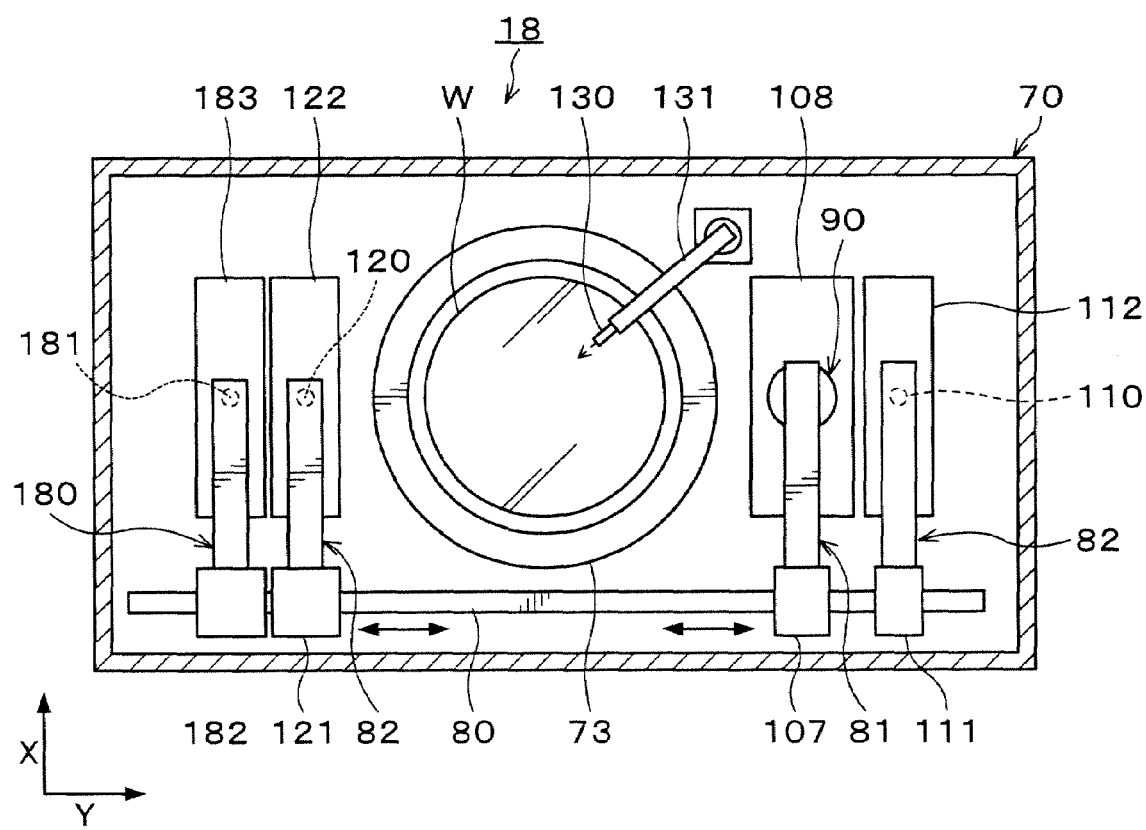
FIG. 14 is an explanatory view of a transverse section showing the outline of a configuration of a planarization apparatus including a megasonic nozzle.

While the spray nozzle 120 for supplying the cleaning solution to the wafer W is provided in the planarization apparatus 18 in the above embodiment, a megasonic nozzle may be additionally provided which sprays a cleaning solution to which ultrasonic wave is applied. In this case, for example, a fourth arm 180 is provided on the rail 80 as shown in FIG. 14, and a megasonic nozzle 181 is supported on the fourth arm 180. The fourth arm 180 is freely movable on the rail 80 in the Y-direction, for example, by means of an arm drive unit 182 and can horizontally move the megasonic nozzle 181 from a waiting section 183 into the cup 73 and move it in the horizontal direction above the front surface of the wafer W. Further, the fourth arm 180 can freely rise and lower, for example, by means of the arm drive unit 182 to adjust also the height of the megasonic nozzle 181. The megasonic nozzle 181 communicates with the cleaning solution supply source 123 via the supply pipe 124 similarly to the spray nozzle 120.

During the cleaning step in the planarization processing, the megasonic nozzle 181 supplies the cleaning solution to the front surface of the wafer W while moving above the wafer W together with the spray nozzle 120. This arrangement increases the cleaning power to allow for efficient removal of the residual of the coating insulating film A remaining on the wafer front surface.

Figure 15:
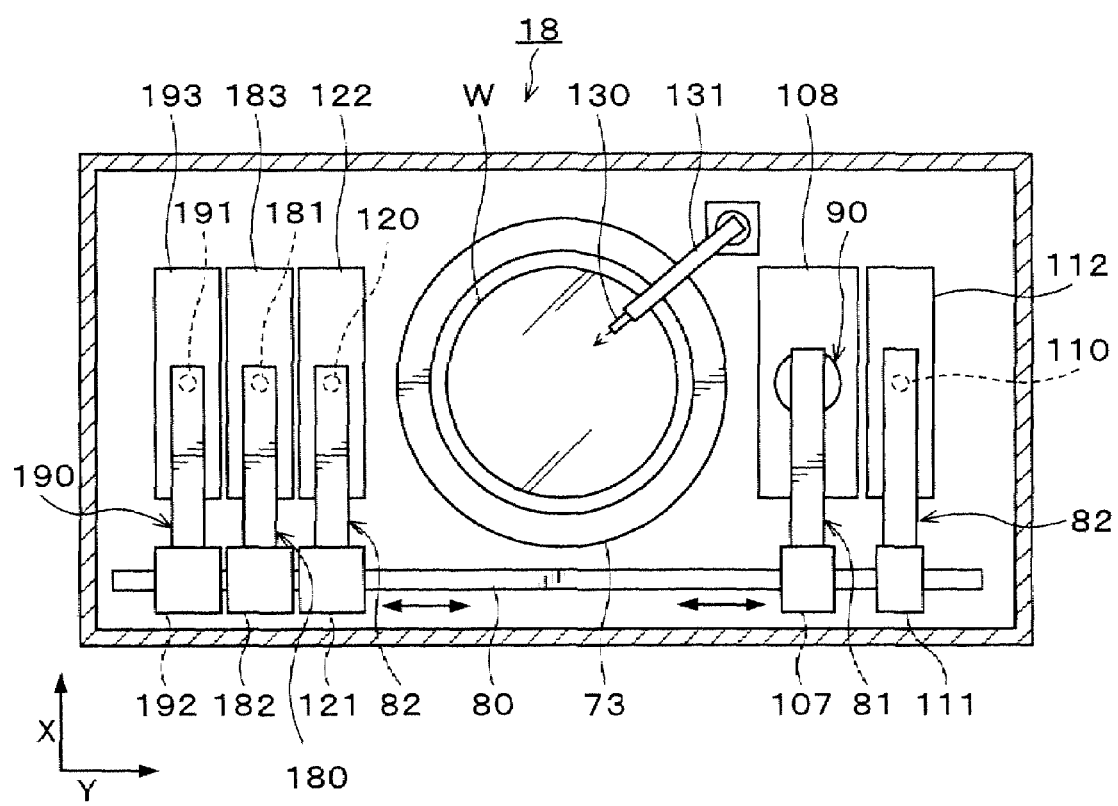
FIG. 15 is an explanatory view of a transverse section showing the outline of a configuration of a planarization apparatus including a cleaning body.

In the above embodiment, the planarization apparatus 18 may be provided with a cleaning body for supplying a cleaning solution to the contact portion with the cleaning body being in contact with the wafer W. In this case, for example, a fifth arm 190 is provided on the rail 80 as shown in FIG. 15, and a cleaning body 191 is supported on the fifth arm 190. The cleaning body 191 has, for example, the same configuration as that of the brush mechanism 170 shown in FIG. 13, and comprises a brush 171, a rotary shaft 172, a liquid storage container 173, nozzles 174, and a liquid passage 176 leading to a liquid supply port 175.

The fifth arm 190 is freely movable on the rail 80 in the Y-direction, for example, by means of an arm drive unit 192 shown in FIG. 15 and can horizontally move the cleaning body 191 from a waiting section 193 into the cup 73 and move it in the horizontal direction on the front surface of the wafer W. Further, the fifth arm 190 can freely rise and lower, for example, by means of the arm drive unit 192 to adjust also the height of the cleaning body 191. The nozzle 174 of the cleaning body 191 communicates with the cleaning solution supply source 123 via the supply pipe 124 similarly to the spray nozzle 120. Accordingly, the cleaning solution is discharged from the nozzles 174, and the cleaning solution is supplied from the liquid supply port 175.

During the cleaning step in the planarization processing, the cleaning body 191 rotating on its axis is pressed against the central portion of the wafer W at a predetermined pressure, and the cleaning solution is supplied from the liquid supply port 175 in the center of the cleaning body 191. The cleaning body 191 horizontally moves above the front surface of the wafer W together with the spray nozzle 120 and the megasonic nozzle 181 which are spraying the cleaning solutions to remove the residual of the coating insulating film A remaining on the wafer front surface. In this case, the residual on the wafer front surface can be removed more efficiently.

While the above embodiment includes the megasonic nozzle 181 and the cleaning body 191 in addition to the spray nozzle 120, each of the megasonic nozzle 181 and the cleaning body 191 may be independently provided without providing the spray nozzle 120. Alternatively, two of more of the spray nozzle 120, the megasonic nozzle 181 and the cleaning body 191 may be used in combination.

Preferred embodiments of the present invention have been described above with reference to the accompanying drawings, but the present invention is not limited to the embodiment. It should be understood that various changes and modifications are readily apparent to those skilled in the art within the scope of the spirit as set forth in claims, and those should also be covered by the technical scope of the present invention. An insulating film is formed and planarized in the above embodiment, but the present invention is also applicable to the case in which a coating film other than the insulating film is planarized. Further, the present invention is applicable not only to a coating film formed by the spin coating method of coating the wafer with the wafer being rotated, but also to a scan coating method of applying the coating solution with the nozzle discharging the coating solution and the wafer W being relatively moved. Besides, the present invention is also applicable to a substrate other than the wafer W, such as an FPD (Flat Panel Display), a mask reticle for a photomask, and the like.

The present invention is useful in planarizing the coating film.

What is claimed is:

1. A planarization apparatus for planarizing a coating film applied on a substrate before the coating film is hardened, comprising:
    a contact body configured to be brought into contact with a front surface of the coating film on the substrate;
    a contact body drive mechanism for pressing said contact body against the front surface of the coating film and moving said contact body along the front surface of the coating film to planarize the front surface of the coating film;
    a distortion detection sensor for detecting distortion of the substrate;
    a control unit for controlling a height of said contact body with respect to the substrate based on a detection result of the distortion by said distortion sensor in order to planarize the coating film to a predetermined film thickness; and
    a processing liquid supply unit for supplying a processing liquid to be supplied to the substrate when said contact body planarizes the coating film,
    wherein the processing liquid is a solvent for the coating film.

2. The planarization apparatus as set forth in claim 1, further comprising:
    a rotary holding member for holding and rotating the substrate,
    wherein said contact body is pressed against the substrate when the substrate is held and rotated by said rotary holding member.

3. The planarization apparatus as set forth in claim 1, further comprising:
    a film thickness sensor for detecting a film thickness of the coating film; and
    a control unit for controlling a pressure of said contact body against the substrate based on a detection result of the film thickness by said film thickness sensor in order to planarize the coating film to a predetermined film thickness.

4. The planarization apparatus as set forth in claim 3,
    wherein said contact body drive mechanism includes a support member for supporting and moving said contact body, and
    wherein said film thickness sensor is attached to said support member.

5. The planarization apparatus as set forth in claim 1,
    wherein said contact body drive mechanism includes a support member for supporting and moving said contact body, and
    wherein said distortion detection sensor is attached to said support member.

6. The planarization apparatus as set forth in claim 1, wherein said processing liquid supply unit is provided in said contact body.

7. The planarization apparatus as set forth in claim 1,
    wherein said processing liquid supply unit includes a first nozzle for supplying the processing liquid to a central portion of the substrate and a second nozzle for supplying the processing liquid between the central portion and an outer edge portion of the substrate.

8. The planarization apparatus as set forth in claim 1, further comprising:
    a cleaning solution supply unit for supplying a cleaning solution to the substrate after the coating film is planarized by said contact body.

9. The planarization apparatus as set forth in claim 8, wherein the cleaning solution is a solvent for the coating film.

10. The planarization apparatus as set forth in claim 8, wherein said cleaning solution supply unit includes at least one of a nozzle for spraying the cleaning solution, a megasonic nozzle for spraying the cleaning solution to which an ultrasonic vibration is applied, and a cleaning body for supplying the cleaning solution to a contact portion with said cleaning body in contact with the substrate.

11. The planarization apparatus as set forth in claim 1, wherein said contact body is rotationally driven.

12. The planarization apparatus as set forth in claim 1, wherein said contact body is in a sponge form.

13. The planarization apparatus as set forth in claim 11, further comprising:
   a rotary shaft for rotating the contact body; and
   a pressure sensor placed on an upper end portion of the rotary shaft for detecting a pressing pressure of the contact body against the substrate,
   wherein the upper end portion of the rotary shaft is formed in a tapered conical shape and abuts on the pressure senor.

14. The planarization apparatus as set forth in claim 1, wherein said contact body is made of urethane.

\* \* \* \* \*